United States Patent
Sandhu

(10) Patent No.: US 6,770,924 B1
(45) Date of Patent: Aug. 3, 2004

(54) AMORPHOUS TIN FILMS FOR AN INTEGRATED CAPACITOR DIELECTRIC/BOTTOM PLATE USING HIGH DIELECTRIC CONSTANT MATERIALS

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 409 days.

(21) Appl. No.: 09/496,081

(22) Filed: Feb. 1, 2000

Related U.S. Application Data

(62) Division of application No. 08/868,651, filed on Jun. 4, 1997, now Pat. No. 6,107,105, which is a continuation of application No. 08/242,566, filed on May 13, 1994, now abandoned.

(51) Int. Cl.[7] .............................................. H01L 27/108
(52) U.S. Cl. ..................... 257/296; 257/296; 257/301; 257/302; 257/303; 257/304; 257/306; 257/310; 257/311; 438/238; 438/239
(58) Field of Search ................................. 257/301, 302, 257/303, 304, 306, 310, 311, 296; 438/238, 239

(56) References Cited

U.S. PATENT DOCUMENTS

| | | | |
|---|---|---|---|
| 5,168,073 A | 12/1992 | Gonzalez et al. ............. | 437/47 |
| 5,192,589 A | 3/1993 | Sandhu ..................... | 427/255.1 |
| 5,246,881 A | 9/1993 | Sandhu et al. .............. | 437/192 |
| 5,279,985 A | 1/1994 | Kamiyama .................... | 437/60 |
| 5,335,138 A | 8/1994 | Sandhu et al. .............. | 361/303 |
| 5,434,044 A * | 7/1995 | Nulman et al. ............. | 437/192 |
| 5,466,629 A | 11/1995 | Mihara et al. ................ | 437/60 |
| 5,489,548 A | 2/1996 | Nishioka et al. .............. | 437/60 |
| 5,504,041 A | 4/1996 | Summerfelt et al. ........ | 437/225 |
| 6,081,034 A * | 6/2000 | Sandhu et al. .............. | 257/764 |

FOREIGN PATENT DOCUMENTS

| | | | | |
|---|---|---|---|---|
| GB | 2245762 | * | 1/1992 | .................. 257/296 |
| WO | WO 87/05152 | | 8/1987 | |

* cited by examiner

*Primary Examiner*—Allan R. Wilson
*Assistant Examiner*—Edgardo Ortiz

(57) ABSTRACT

The present invention provides a capacitor formed in a dynamic random access memory (DRAM) semiconductor device, the capacitor comprising: a polysilicon layer to making contact with a diffusion region of an access device; a TiN comprising layer overlying the polysilicon layer; the TiN comprising layer and the polysilicon layer are patterned to serve as a bottom capacitor plate; a layer of dielectric material overlying the patterned TiN comprising layer; and a top capacitor plate. A method for forming the capacitor comprises the steps of: providing a opening to a diffusion region in an underlying substrate of a wordline activated transistor; forming a TiN comprising layer to make contact with the diffusion via the opening; patterning the TiN comprising layer into an individual bottom capacitor plate; forming a layer of dielectric material; and forming a top capacitor plate.

9 Claims, 2 Drawing Sheets

US 6,770,924 B1

AMORPHOUS TiN FILMS FOR AN INTEGRATED CAPACITOR DIELECTRIC/BOTTOM PLATE USING HIGH DIELECTRIC CONSTANT MATERIALS

This application is a divisional to U. S. patent application Ser. No. 08/868,651 now U.S. Patent No. 6,107,105, filed Jun. 4, 1997, which is a continuation to U.S. patent application Ser. No. 08/242,566, filed May 13, 1994, now abandoned.

FIELD OF THE INVENTION

This invention relates generally to semiconductor fabrication and in particular to a capacitor structure and a method to form same that has a bottom plate made from a layer of material comprising titanium nitride.

BACKGROUND OF THE INVENTION

During semiconductor fabrication of storage capacitors, recent attention has been paid to barium strontium titanate (BST), lead zirconium titanate (PZT) and lead lanthanum titanate (PLZT) for use as capacitor dielectric materials. Such dielectric materials possess a high dielectric constant and are particularly attractive for use in the formation of storage capacitors in high density memory devices.

One major hurdle to overcome to incorporate these materials into present day designs is the fact that during chemical vapor deposition (CVD), the underlying capacitor electrode (or bottom plate) is exposed to oxygen at high temperatures which oxidizes the exposed bottom plate.

For example, a capacitor made up of a polysilicon-BST sandwich is reduced in capacitance due to a thin silicon dioxide layer that forms on the polysilicon bottom plate. A platinum covering on the polysilicon has been suggested to avoid the oxidation of the polysilicon. Unfortunately, during the thermal cycles the platinum undergoes physical degradation due to the out-diffusion of the conductive dopant atoms resident in the polysilicon into the platinum.

Also, sputtered titanium nitride (TiN), titanium chloride (TiCl$_4$) and CVD TiN have been known to fail due to the out-diffusion, along the grain boundaries of the sputter material, of conductive dopant atoms resident in the polysilicon.

The present invention teaches a method and structure that can efficiently and reliably fabricate capacitors using a material that possesses a high dielectric constant.

SUMMARY OF THE INVENTION

The present invention describes a capacitor formed in a semiconductor device, the capacitor comprising:
a TiN comprising layer making contact with a diffusion region of an access device, the TiN comprising layer is patterned to serve as a bottom capacitor plate;
a layer of dielectric material overlying the patterned TiN comprising layer; and
a top capacitor plate.
A method for forming a capacitor of the present invention is described in semiconductor fabrication process that comprises the steps of:
providing an opening to a diffusion region of an underlying substrate;
forming a TiN comprising layer to make contact with the diffusion via the opening;
patterning the TiN comprising layer into an individual bottom capacitor plate;
forming a layer of dielectric material; and
forming a top capacitor plate.

BRIEF DESCRIPTION OF THE INVENTION

DETAILED DESCRIPTION OF THE INVENTION

The present invention, as depicted in the several embodiments of FIGS. 1–5 demonstrates process steps integrated into a fabrication process of semiconductor device, such as for a dynamic random access memory (DRAM), that will provide storage capacitor structures. Though, the process described hereinafter, may be taken as referenced to DRAM fabrication, it is meant to serve as an example for practicing the present invention. As one skilled in the art will recognize from the detailed description that follows, the present invention may be integrated into any semiconductor fabrication process that requires the formation of capacitors and in particular storage capacitors.

Figure 1:
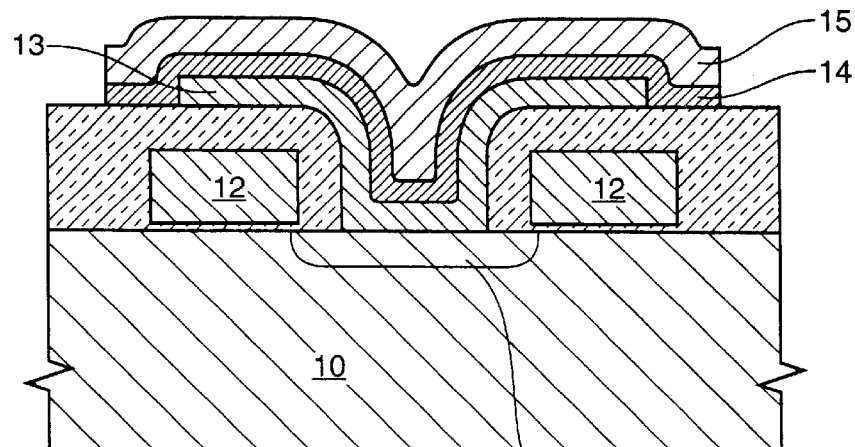
FIG. 1 is a composite cross-sectional view of a process wafer portion depicting a first embodiment of the present invention.

As a first embodiment of the present invention and referring now to FIG. 1, starting silicon substrate 10 has been implanted with a conductive dopant (p-type or n-type, depending on the desired use) to form diffusion region 11. Diffusion region 11 bridges between two neighboring control gates 12. For example in a DRAM control gates are formed from parallel wordlines that are used to access a storage capacitor yet to be discussed. The formation of a the storage capacitor having a unique construction is the essence of the present invention.

First, an opening is provided to expose a major portion of diffusion region 11. Next, a titanium nitride (TiN) comprising layer 13 is formed over gates 12 and into the opening to make contact to the exposed diffusion region 11 and then patterned to form the bottom capacitor plate. The TiN comprising layer may be formed by several methods such as, inorganic chemical vapor deposition, chemical vapor deposition, sputter deposition. However, it is preferred to form the TiN comprising layer by metal organic chemical vapor deposition (MOCVD).

The TiN comprising layer may be any material that contains TiN. For example a suitable TiN comprising layer is TiN$_x$C$_y$O$_z$, layer, where variables x, y and z range from 1 to 0. It is preferred to use a TiN comprising layer that is predominantly amorphous TiN as the amorphous TiN provides an excellent barrier to prevent the out-diffusion of conductive dopants resident in underlying layers. To further enhance the effectiveness of the TiN comprising layer 13, the TiN comprising layer is exposed to an oxide ambient and thereby at least partially oxidizing TiN comprising layer. The amount of the TiN layer consumed by oxidation can range from the thinnest layer of oxidation to complete oxidation which would satisfy the definition set forth of "at least partially oxidizing."Next, a layer 14 of dielectric material is formed by methods known to those skilled in the art and preferably by chemical vapor deposition (CVD). Though, any dielectric suitable for use as a capacitor dielectric, such as silicon oxide ($SiO_2$) and silicon nitride ($Si_3N_4$) it is preferred to use a dielectric material that has a dielectric constant is greater than 7. Suitable dielectric material would be a material selected from barium strontium titanate (BST), lead zirconium titanate (PZT) and lead lanthanum titanate (PLZT). If so desired the dielectric material can then be planarized.

Finally, a top capacitor plate 15 is formed from a conductive material to complete the capacitor structure of FIG. 1.

Figure 2:
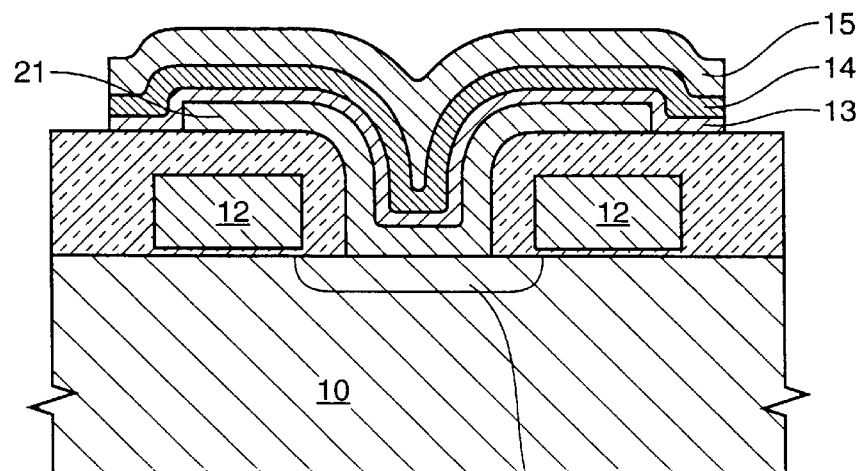
FIG. 2 is a composite cross-sectional view of a process wafer portion depicting a second embodiment of the present invention.

As a second embodiment of the present invention and referring now to FIG. 2, the same process steps are followed to form the structure of FIG. 2 as those used to form the structure of FIG. 1, except that a conductively doped polysilicon layer 21 has been formed prior to the formation of the TiN comprising layer 13. Subsequently these two layers (21 and 13) are patterned to form the bottom capacitor plate. The structure is then completed as in FIG. 1.

Figure 3:
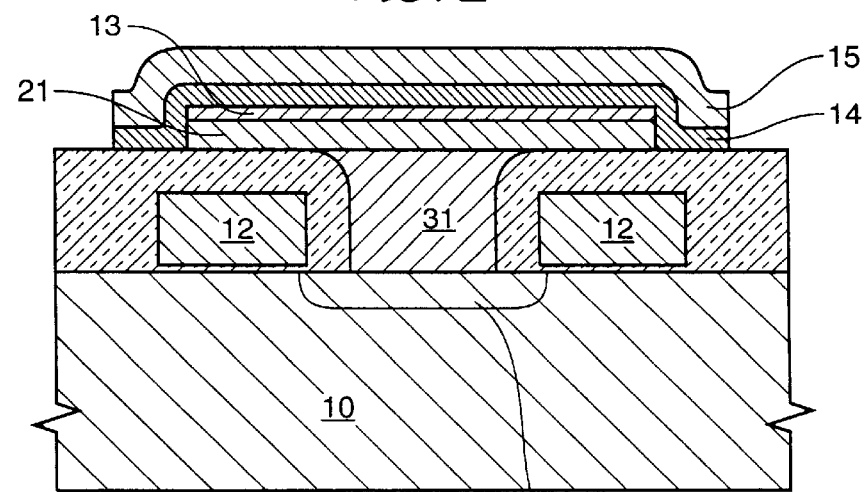
FIG. 3 is a composite cross-sectional view of a process wafer portion depicting a third embodiment of the present invention.
Figure 4:
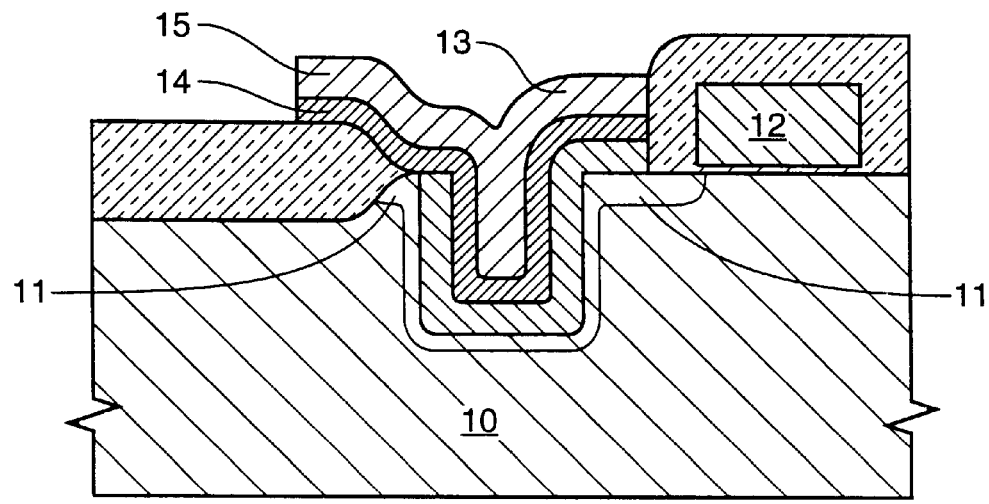
FIG. 4 is a composite cross-sectional view of a process wafer portion depicting a fourth embodiment of the present invention.
Figure 5:
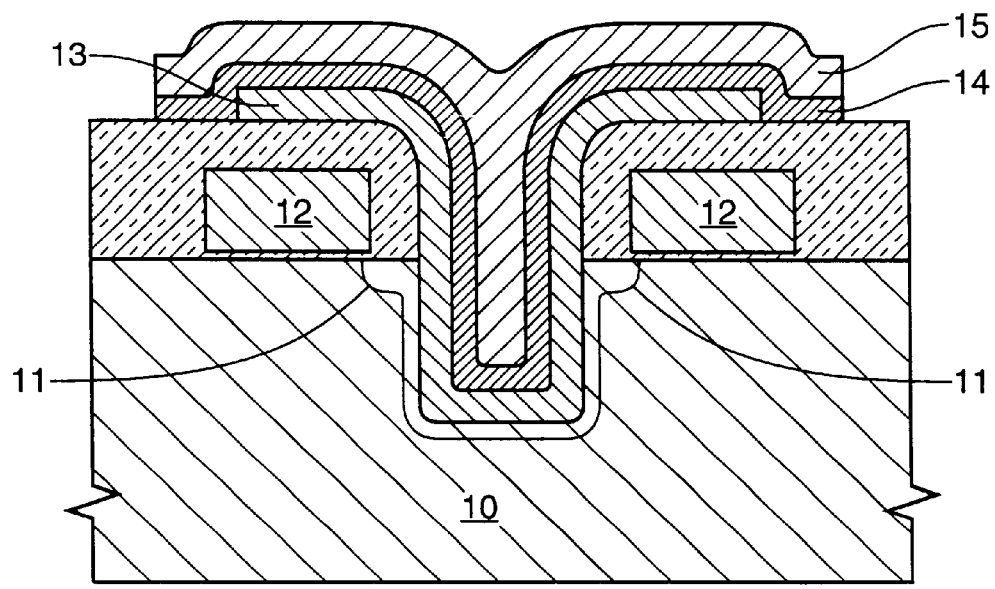
FIG. 5 is a composite cross-sectional view of a process wafer portion depicting a fifth embodiment of the present invention.

FIGS. 3–5 represent the incorporation of the present invention into various capacitor processes. Referring to FIG. 3, a planar capacitor making contact to a conductive plug 31, is formed using the process steps described along with FIG. 1. Though both a polysilicon layer 21 and a TiN layer 13 are shown, the polysilicon layer need not be present. Also, a planar capacitor could be constructed over the diffusion region 11 as the plug 31 need not be present.

FIG. 4 depicts a trench capacitor that is formed using the process steps described along with FIG. 1. In this case only TiN layer 13 is shown, however an underlying polysilicon layer could be added so both layers would form the bottom capacitor.

FIG. 5 depicts a trench-stacked capacitor that is formed using the process steps described along with FIG. 1. Again, in this case only TiN layer 13 is shown, however an underlying polysilicon layer could be added so both layers would form the bottom capacitor.

It is to be understood that although the present invention has been described in a preferred embodiment, various modifications known to those skilled in the art may be made without departing from the invention as recited in the several claims appended hereto.

What is claimed is:

1. A capacitor in a semiconductor device, said capacitor comprising:

a bottom capacitor plate consisting essentially of amorphous TiN;

a layer of dielectric material overlying said bottom capacitor plate; and a top capacitor plate overlying said layer of dielectric material.

2. The capacitor as recited in claim 1, wherein said amorphous TiN comprises a partially oxidized portion.

3. The capacitor as recited in claim 1, wherein said dielectric material is a material selected from silicon oxide ($SiO_2$) and silicon nitride ($Si_3N_4$).

4. The capacitor as recited in claim 1, wherein said dielectric material has a dielectric constant that is greater than 7.

5. The capacitor as recited in claim 4, wherein said dielectric material comprises a material selected from barium strontium titanate (BST), lead zirconium titanate (PZT) and lead lanthanum titanate (PLZT).

6. A capacitor in a dynamic random access memory (DRAM) semiconductor device, said capacitor comprising:

a bottom capacitor plate consisting essentially of amorphous TiN overlying a polysilicon layer;

a layer of dielectric material overlying said bottom capacitor plate; and a top capacitor plate overlying said layer of dielectric material.

7. The capacitor as recited in claim 6, wherein said dielectric material is a material selected from silicon oxide ($SiO_2$) and silicon nitride ($Si_3N_4$).

8. The capacitor as recited in claim 6, wherein said dielectric material has a dielectric constant that is greater than 7.

9. The capacitor as recited in claim 8, wherein said dielectric material comprises a material selected from barium strontium titanate (BST), lead zirconium titanate (PZT) and lead lanthanum titanate (PLZT).

\* \* \* \* \*